US010236061B2

(12) United States Patent
Hou et al.

(10) Patent No.: US 10,236,061 B2
(45) Date of Patent: Mar. 19, 2019

(54) RESISTIVE RANDOM ACCESS MEMORY HAVING CHARGE TRAPPING LAYER, MANUFACTURING METHOD THEREOF, AND OPERATION THEREOF

(71) Applicant: Winbond Electronics Corp., Taichung (TW)

(72) Inventors: Tuo-Hung Hou, Taichung (TW); Boris Hudec, Taichung (TW); Che-Chia Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 59 days.

(21) Appl. No.: 15/484,137

(22) Filed: Apr. 11, 2017

(65) Prior Publication Data

US 2018/0090207 A1 Mar. 29, 2018

(30) Foreign Application Priority Data

Sep. 29, 2016 (CN) .......................... 2016 1 0863789

(51) Int. Cl.
*G11C 11/00* (2006.01)
*G11C 13/00* (2006.01)
*H01L 27/24* (2006.01)
*H01L 45/00* (2006.01)

(52) U.S. Cl.
CPC ........ *G11C 13/0097* (2013.01); *G11C 13/004* (2013.01); *H01L 27/249* (2013.01); *H01L 27/2463* (2013.01); *H01L 45/10* (2013.01); *H01L 45/1226* (2013.01); *H01L 45/1233* (2013.01); *H01L 45/146* (2013.01); *H01L 45/16* (2013.01); *H01L 45/1608* (2013.01); *G11C 2213/32* (2013.01)

(58) Field of Classification Search
CPC . G11C 13/00; G11C 13/0014; G11C 13/0016; G11C 13/0007; G11C 13/0069; G11C 2213/56
USPC ................................ 365/148, 158, 171, 173
See application file for complete search history.

(56) References Cited

U.S. PATENT DOCUMENTS 7,029,924 B2 * 4/2006 Hsu ..................... G11C 13/0007
257/E27.004
7,256,429 B2 * 8/2007 Hsu ..................... G11C 13/0007
257/108

(Continued)

FOREIGN PATENT DOCUMENTS

TW 201511030 3/2015
TW I517468 1/2016
TW I523290 2/2016

OTHER PUBLICATIONS

"Office Action of Taiwan Counterpart Application," dated May 26, 2017, p. 1-p. 7.

*Primary Examiner* — Gene N Auduong
(74) *Attorney, Agent, or Firm* — JCIPRNET (57) ABSTRACT

A resistive random access memory (RRAM) including a first electrode, a second electrode, and a charge trapping layer is provided. The second electrode is located on the first electrode. The charge trapping layer is located between the first electrode and the second electrode. The charge trapping includes a first region and a second region. The first region has a first dopant and is close to the first electrode. The second region has a second dopant and is close to the second electrode.

19 Claims, 4 Drawing Sheets

(56) References Cited

U.S. PATENT DOCUMENTS

| | | | |
|---|---|---|---|
| 7,417,271 B2 * | 8/2008 | Genrikh | H01L 27/115 257/223 |
| 7,498,600 B2 * | 3/2009 | Cho | H01L 45/12 257/2 |
| 7,518,213 B2 * | 4/2009 | Bae | G11C 13/00 257/536 |
| 8,673,692 B2 | 3/2014 | Tan et al. | |
| 2010/0276658 A1 | 11/2010 | Chien et al. | |

* cited by examiner

FIG. 3D

RESISTIVE RANDOM ACCESS MEMORY HAVING CHARGE TRAPPING LAYER, MANUFACTURING METHOD THEREOF, AND OPERATION THEREOF

CROSS-REFERENCE TO RELATED APPLICATION

This application claims the priority benefit of China application serial no. 201610863789.2, filed on Sep. 29, 2016. The entirety of the above-mentioned patent application is hereby incorporated by reference herein and made a part of this specification.

BACKGROUND OF THE INVENTION

Field of the Invention

The invention relates to a memory, a manufacturing method thereof and an operation thereof, and particularly relates to a resistive random access memory, a manufacturing method thereof and an operation thereof.

Description of Related Art

A memristor is a two-terminal device, which uses electric field-induced resistance-switching (RS) to change a resistance state thereof. Since the change of the resistance state is non-volatile, the memristor can be applied to artificial neuromorphic synapses, fuzzy-logic devices and resistive random access memories (RRAM), etc.

The RRAM is widely applied in a non-volatile memory field. Since the RRAM has a simple crossbar array and is suitable for low temperature manufacturing, the RRAM has the best potential to replace the existing flash memory. Although the crossbar array architectures of the RRAM theoretically allows the minimum memory cell size of $4F^2$ (where F is the minimum feature size), and the low temperature manufacturing allows stacking of the memory arrays to reach an unprecedented integrated density, in a 1R structure (i.e. only one resistive element is included), an undesired sneak current may flow through an adjacent unselected memory cell to severely influence a read margin and limit the maximum size of the crossbar array. Such problem can be resolved by using an additional non-linear selection device to connect the resistive switching elements in series. Therefore, structures of one diode in collaboration with one resistor (1D1R) and one selector in collaboration with one resistor (1S1R) seem to have become main competitors of 3D stacked memory application.

However, when the aforementioned 1D1R and 1S1R structures are applied to the 3D crossbar array, it is liable to have a process problem, so that the above structures cannot be actually applied to the manufacturing process of the 3D memory. Therefore, to implement a non-linear resistive switching element without using an additional selection device becomes an important issue in development of the 3D memory with the RRAM.

SUMMARY OF THE INVENTION

The invention is directed to a resistive random access memory (RRAM), a manufacturing method thereof and an operation thereof, the RRAM has a non-linear resistance value without using an additional selection device, so that an area thereof is decreased to achieve a high density three-dimensional stacked RRAM array.

The invention provides a resistive random access memory (RRAM), a manufacturing method thereof and an operation thereof, and the RRAM does not have conventional forming, filament and ionic movement, so that an effect of low power consumption is achieved.

The invention provides a resistive random access memory including a first electrode, a second electrode, and a charge trapping layer. The second electrode is located on the first electrode. The charge trapping layer is located between the first electrode and the second electrode. The charge trapping layer includes a first region and a second region. The first region has a first dopant and is close to the first electrode. The second region has a second dopant and is close to the second electrode.

The invention provides a manufacturing method of a resistive random access memory, which includes following steps. A first electrode is provided, and a charge trapping layer is formed on the first electrode. A second electrode is formed on the charge trapping layer.

The invention provides an operation of a memory device, which includes following steps. The aforementioned resistive random access memory is provided. In a setting operation, a positive bias is applied to the second electrode, such that a plurality of electrons is injected to the first region of the charge trapping layer from the first electrode, and is blocked by the second region of the charge trapping layer. In a resetting operation, a negative bias is applied to the second electrode, such that the electrons are escaped to the first electrode from the first region of the charge trapping layer.

According to the above description, the RRAM of the invention is only a 1R memory structure, and has a non-linear resistance value without requiring an additional selection device. Therefore, compared to the conventional RRAM (for example, the 1D1R and 1S1R structure), the RRAM of the invention has a smaller area. Moreover, the RRAM of the invention may omit an initial forming step (forming-free), and it is unnecessary to adopt an initial forming voltage with a larger value for activation, so as to avoid damaging the RRAM structure and improve reliability thereof. On the other hand, the RRAM of the invention can omit filament forming and ionic movement, so as to achieve a low power consumption effect.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. Wherever possible, the same or similar reference numbers are used in the drawings and the description to refer to the same or similar components, and are not repeated again in the following paragraphs.

Figure 1:
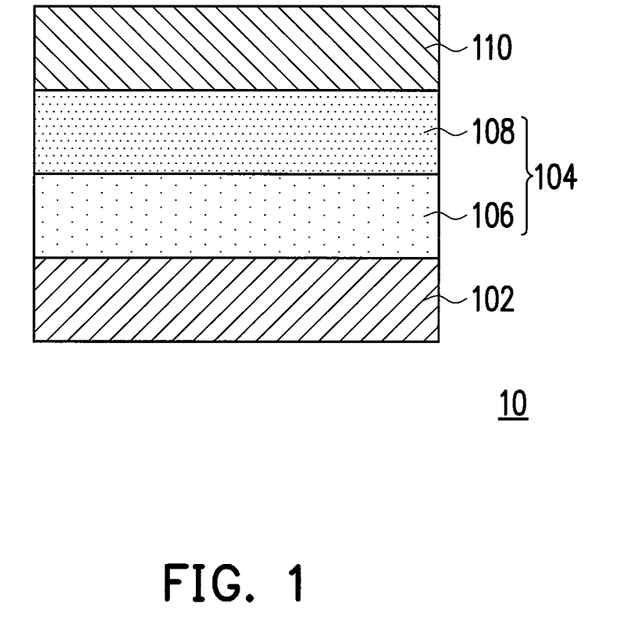
FIG. 1 is a cross-sectional view of a resistive random access memory (RRAM) according to a first embodiment of the invention.

FIG. 1 is a cross-sectional view of a resistive random access memory (RRAM) according to a first embodiment of the invention.

Referring to FIG. 1, the RRAM 10 of the first embodiment of the invention includes a first electrode 102, a charge trapping layer 104 and a second electrode 110. The second electrode 110 is located on the first electrode 102. In an embodiment, the first electrode 102 and the second electrode 110 respectively include a conductive material, and a method for forming the first electrode 102 and the second electrode 110 is, for example, physical vapour deposition. The conductive material may include, for example, a metal material, a metal nitride, or a similar conductive material. The metal material includes at least one metal in the group consisting of Ti, Ta, Ni, Cu, W, Hf, Zr, Nb, Y, Zn, Co, Al, Si, Ge. The metal nitride includes a nitride of at least one metal selected from the group consisting of Ti, Ta, Ni, Cu, W, Hf, Zr, Nb, Y, Zn, Co, Al, Si, Ge. In an embodiment, the first electrode 102 and the second electrode 110 may adopt different materials. For example, the first electrode 102 can be a TiN layer, and the second electrode 110 can be a Ta layer. Alternatively, the first electrode 102 can be a Ta layer, and the second electrode 110 can be an Hf layer. In another embodiment, the first electrode 102 and the second electrode may adopt a same material. For example, the first electrode 102 and the second electrode 110 are respectively the TiN layer or the Ta layer.

The charge trapping layer 104 is located between the first electrode 102 and the second electrode 110. The charge trapping layer 104 includes a first region 106 and a second region 108. The first region 106 has a first dopant and is close to the first electrode 102. The second region 108 has a second dopant and is close to the second electrode 110.

In an embodiment, the charge trapping layer 104 may include an insulating material with an energy gap smaller than 5 eV. The insulating material includes at least one insulating material selected from the group consisting of $TiO_2$, NiO, HfO, $HfO_2$, ZrO, $ZrO_2$, $Ta_2O_5$, ZnO, $WO_3$, CoO and $Nb_2O_5$. For example, the charge trapping layer 104 may include $TiO_2$. Though the invention is not limited thereto, and in other embodiments, the energy gap of the charge trapping layer 104 can be adjusted according to an actual requirement.

In an embodiment, the first dopant and the second dopant respectively include at least one element selected from the group consisting of Ti, Zr, Fe, Co, Al, S, N, Ca, Cu, Pb, Sr, Hf, B, C, Mo, Zn, Mg. In an embodiment, the first dopant and the second dopant can be different. For example, the first dopant can be Al, and the second dopant can be Hf, though the invention is not limited thereto, and in other embodiments, it is considered to be consistent with the spirit of the invention as long as the types of the first dopant and the second dopant are adjusted to make the energy gap of the second region 108 having the second dopant to be greater than the energy gap of the first region 106 having the first dopant. In an embodiment, the energy gap of the second region 108 is greater than the energy gap of the first region 106 by at least 1 eV. Therefore, in the present embodiment, an electron trapping capability of the first region 106 of the charge trapping layer 104 is improved, and in case that an electric field is applied, ionic movement of the first region 106 is suppressed to keep oxygen vacancies or stationary of other ions. On the other hand, the second region 108 of the charge trapping layer 104 may avoid or block the electrons from flowing to the second electrode 110 from the first region 106 (or the first electrode 102), so as to further improve the electron trapping capability of the first region 106. In other words, the second region 108 of the charge trapping layer 104 may control retention of a non-volatile resistance state, so as to improve reliability of the RRAM 10.

In an embodiment, a concentration of the first dopant in the first region 106 is between 1 at % and 50 at %, wherein the at % is referred as atomic ratio which gives the percentage of atoms of first dopant relative to the total number of atoms in the first region 106. A concentration of the second dopant in the second region 108 is between 10 at % to 90 at %, wherein the at % is referred as atomic ratio which gives the percentage of atoms of second dopant relative to the total number of atoms in the second region 108. In an embodiment, a thickness of the first region 106 is about 5-15 nm, and a thickness of the second region 108 is about 5-10 nm, though the invention is not limited thereto, and the thickness of the first region 106 and the second region 108 can be adjusted according to user's requirement.

In an embodiment, when the first dopant and the second dopant are the same, the concentration of the first dopant in the first region 106 can be smaller than the concentration of the second dopant in the second region 108, though the invention is not limited thereto, and in other embodiments, when the first dopant and the second dopant are different, the concentration of the first dopant in the first region 106 can also be smaller than the concentration of the second dopant in the second region 108.

In another embodiment, when the first dopant and the second dopant are the same, the concentration of the first dopant (or the concentration of the second dopant) in the first region 106 and the second region 108 of the charge trapping layer 104 may have a gradient distribution, such that the concentration of the first dopant close to the first electrode 102 is smaller than the concentration of the second dopant close to the second electrode 110.

The RRAM 10 of the first embodiment can be a RRAM with a planar type charge trapping layer, though the invention is not limited thereto, and in other embodiments, the RRAM 10 can also be a RRAM with a stacking type charge trapping layer, which is described in detail below.

Figure 2A:
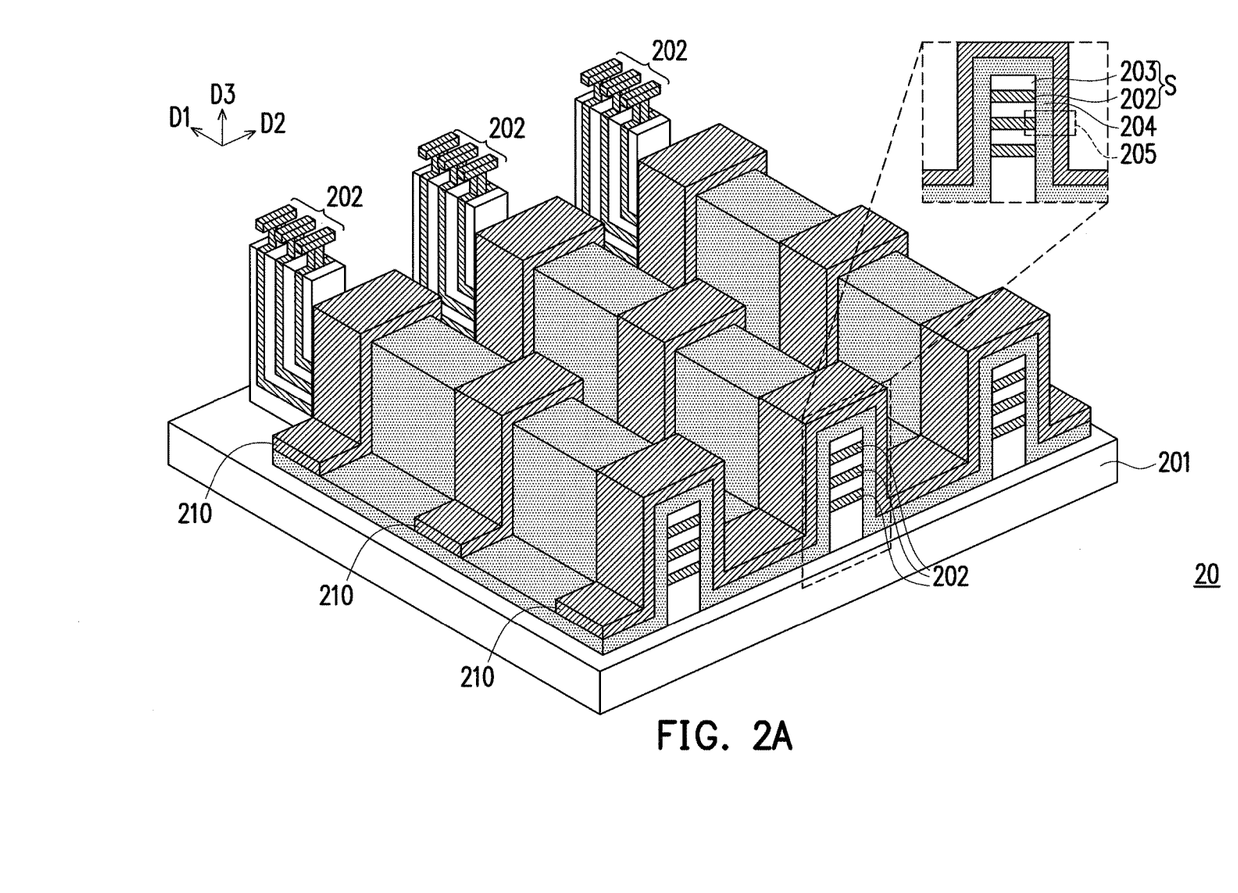
FIG. 2A is a three-dimensional view of a RRAM according to a second embodiment of the invention.
Figure 2B:
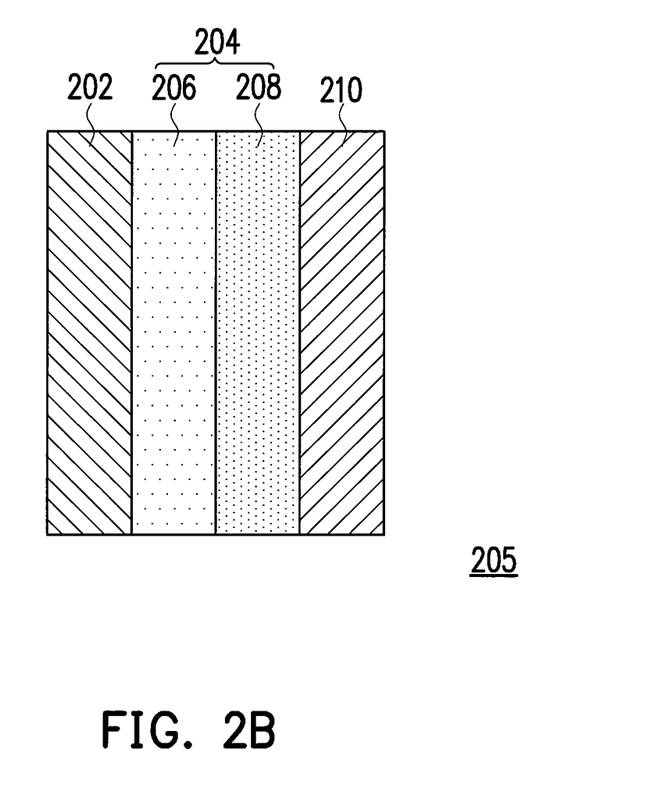
FIG. 2B is a cross-sectional view of a memory cell of FIG. 2A.

FIG. 2A is a three-dimensional view of a RRAM according to a second embodiment of the invention. FIG. 2B is a cross-sectional view of a memory cell of FIG. 2A.

Referring to FIG. 2A and FIG. 2B, the RRAM 20 of the second embodiment of the invention includes a substrate 201, a plurality of first electrodes 202, a plurality of dielectric layers 203, a charge trapping layer 204 and a plurality of second electrodes 210. In an embodiment, the substrate 210 is, for example, a semiconductor substrate, a semiconductor compound substrate or a semiconductor substrate on insulator (SOI).

The first electrodes 202 and the dielectric layers 203 all extend along a first direction D1, and are stacked to each other along a third direction D3 to form a stacked structure S. A material, a forming method of the first electrode 202 is similar to the material and the forming method of the aforementioned first electrode 102, and details thereof are not repeated. The dielectric layer 203 may include, for example, silicon oxide, silicon nitride or a combination thereof, and a forming method thereof is, for example, chemical vapor deposition, thermal oxidation, etc.

The charge trapping layer 204 conformally and blanketly covers a surface (i.e. a top surface and a sidewall) of the stacked structure S (including the first electrode 202 and the dielectric layer 203 stacked with each other).

The second electrode 210 conformally covers portions of the surface (i.e. the top surface and the sidewall) of the stacked structure S (including the first electrode 202 and the dielectric layer 203 stacked with each other) along the second direction D2. A memory cell 205 is formed at an intersection or an overlapped portion of the first electrode 202 and the second electrode 210. A material, a forming method of the second electrode 210 is similar to the material and the forming method of the aforementioned second electrode 110, and details thereof are not repeated. In an embodiment, the first direction D1, the second direction D2 and the third direction D3 are substantially perpendicular to each other.

As shown in FIG. 2B, the memory 205 may include partial electrode 202, partial charge trapping layer 204 and partial second electrode 210. The partial charge trapping layer 204 is located on a sidewall of the partial first electrode 202 to form a vertical type charge trapping layer. The partial second electrode 210 is located on the partial charge trapping layer 204, and the partial charge trapping layer 204 is located between the partial first electrode 202 and the partial second electrode 210. In detail, the charge trapping layer 204 also includes a first region 206 and a second region 208. The first region 206 has a first dopant close to the first electrode 202. The second region 208 has a second dopant close to the second electrode 210. Since materials, concentrations and thickness of the charge trapping layer 204, the first region 206 and the second region 208 of the second embodiment are similar to the materials, the concentrations and the thickness of the charge trapping layer 104, the first region 106 and the second region 108 of the first embodiment, details thereof are not repeated.

Then, a manufacturing method of a RRAM of the invention is described below with reference of the RRAM 10 of the first embodiment.

First, the first electrode 102 is provided. Then, the charge trapping layer 104 is formed on the first electrode 102. Then, the second electrode 110 is formed on the charge trapping layer 104. Since the materials of the first electrode 102, the charge trapping layer 104 and the second electrode have been described in the aforementioned paragraph, details thereof are not repeated.

In an embodiment, a method for forming the charge trapping layer 104 may include forming the charge trapping layer 104 through atomic layer deposition process in situ. In an embodiment, the atomic layer deposition process is, for example, plasma-enhanced atomic layer deposition (PEALD).

To be specific, the atomic layer deposition process includes performing a plurality of first deposition cycles to form a plurality of first material layers having an insulating material. Then, a plurality of second deposition cycles are performed to form a plurality of second material layers having the first dopant. Then, the first deposition cycles and the second deposition cycles are repeated until the first region 106 of the charge trapping layer 104 of the required thickness is formed. In an embodiment, the number of times of the first deposition cycles can be greater than the number of times of the second deposition cycles. For example, 7 times of the first deposition cycle can be performed to form 7 layers of a TiO$_2$ layer. Then, the second deposition cycle is performed once to form 1 layer of an Al$_2$O$_3$ layer. Then, the step of performing 7 times of the first deposition cycle and once of the second deposition cycle is repeated until the thickness of the first region 106 of the charge trapping layer 104 is about 10 nm. However, the invention is not limited thereto, and the spirit of the invention is met as long as the number of times of the first deposition cycle is greater than the number of times of the second deposition cycle.

The first region 106 of the charge trapping layer 104 is formed on the first electrode 102 in situ through the atomic layer deposition process, and the thickness and an Al doping dose (or a doping concentration) of the first region 106 can be adjusted, such that a breakdown voltage, an operation voltage and an operation-current level of the RRAM can be effectively adjusted.

Similarly, after the first region 106 of the charge trapping layer 104 is formed, a plurality of third deposition cycles can be performed to form a third material layer having the insulating material. Then, a plurality of fourth deposition cycles are performed to form a fourth material layer having the second dopant. Then, the third deposition cycles and the fourth deposition cycles are repeated until the second region 108 of the charge trapping layer 104 of the required thickness is formed. In an embodiment, the number of times of the fourth deposition cycles can be greater than the number of times of the third deposition cycles. For example, the third deposition cycle can be performed once to form 1 layer of the TiO$_2$ layer. Then, 9 times of the fourth deposition cycle is performed form 9 layers of an HfO$_2$ layer. Then, the step of performing once of the third deposition cycle and 9 times of the fourth deposition cycle is repeated until the thickness of the second region 108 of the charge trapping layer 104 is about 10 nm. However, the invention is not limited thereto, and the spirit of the invention is met as long as the number of times of the fourth deposition cycle is greater than the number of times of the third deposition cycle.

The second region 108 of the charge trapping layer 104 is formed on the first electrode 102 in situ through the aforementioned atomic layer deposition process, and the thickness and an Hf doping dose (or a doping concentration) of the second region 108 can be adjusted, such that an operation-current level, a resistance state holding and an equilibrium level of the RRAM can be effectively adjusted.

Moreover, since the charge trapping layer is formed through the atomic layer deposition process in situ, the formed charge trapping layer can be conformally and evenly deposited on the vertical sidewall of the first electrode. Therefore, the atomic layer deposition process is adapted to a high density 3D stacked RRAM array, so as to cope with of a trend of lightness, slimness, shortness and smallness of today's technology.

On the other hand, according to the method of forming the charge trapping layer 104, after a material layer (for example, the TiO$_2$ layer) is first formed through a chemical deposition process, and an ion implantation process can be performed to dope Al to the TiO2 layer, so as to form the first region 106 of the charge trapping layer 104. Selectively, after a material layer (for example, the HfO$_2$ layer) is formed on the first region 104 through the chemical deposition process, the ion implantation process can be performed to dope Ti to the HfO$_2$ layer, so as to form the second region 108 of the charge trapping layer 104.

FIG. 3A to FIG. 3D are operation schematic diagrams of the RRAM of FIG. 1.

Figure 3A:
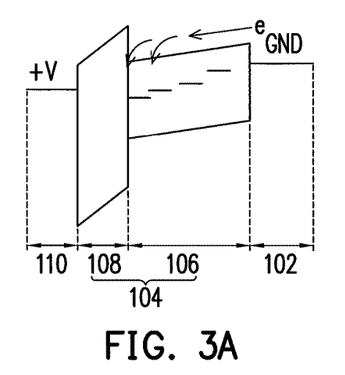
FIG. 3A to FIG. 3D are operation schematic diagrams of the RRAM of FIG. 1.

The RRAM 10 of the first embodiment is taken as an example for description. Referring to FIG. 3A, in a setting operation, a positive bias (for example, +4.0V) is applied to the second electrode 110, such that a plurality of electrons is injected to the first region 106 of the charge trapping layer 104 from the first electrode 102 connected to the ground, and is blocked by the second region 108 of the charge trapping layer 104. Now, a resistance state of the charge trapping layer 104 is changed from a high resistance state (HRS) into a low resistance state (LRS).

Figure 3B:
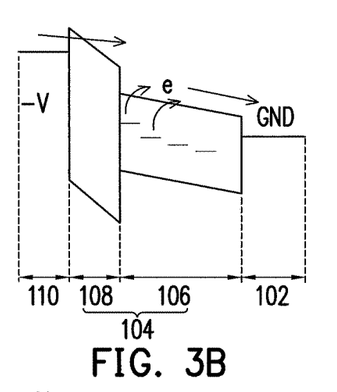

Referring to FIG. 3B, in a LRS read operation, a read negative bias (for example, -2V) is applied to the second electrode 110, such that Fowler-Nordheim (FN) electrons are injected to the first region 106 from the second electrodes 110, and the LRS is determined according to a sum of the captured electrons and the FN electrons in the first region 106.

Figure 3C:
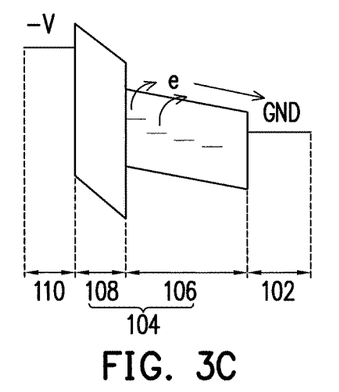

Referring to FIG. 3C, in a resetting operation, a negative bias (for example -8.0V) is applied to the second electrode 110, such that the electrons are escaped to the first electrode 102 connected to the ground from the first region 106 of the charge trapping layer 104. Now, the resistance state of the charge trapping layer 104 is changed from the LRS to the HRS.

Figure 3D:
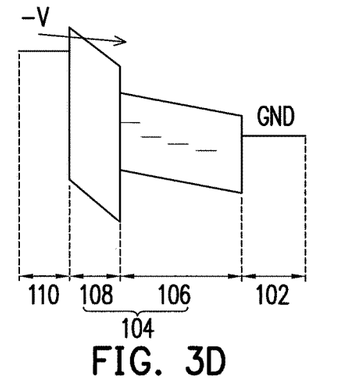

Referring to FIG. 3D, in a HRS read operation, a read negative bias (for example, -2V) is applied to the second electrode 110, such that the FN electrons are injected to the first region 106 from the second electrodes 110, and since the first region 106 is only left with the FN electrons without the captured electrons, it is determined to be the HRS.

In summary, the RRAM of the invention is only a 1R memory structure, and has a non-linear resistance value without requiring an additional selection device. Therefore, compared to the conventional RRAM (for example, the 1D1R and 1S1R structure), the RRAM of the invention has a smaller area. Moreover, the RRAM of the invention may omit an initial forming step (forming-free), and it is unnecessary to adopt an initial forming voltage with a larger value for activation, so as to avoid damaging the RRAM structure and improve reliability thereof. On the other hand, the RRAM of the invention can omit filament forming and ionic movement, so as to achieve a low power consumption effect.

Moreover, the invention adopts the atomic layer deposition process to form the charge trapping layer in situ. Therefore, the atomic layer deposition process is adapted to the high density 3D stacked RRAM array, so as to cope with the trend of lightness, slimness, shortness and smallness of today's technology.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A resistive random access memory, comprising:
   a first electrode;
   a second electrode, located on the first electrode;
   a charge trapping layer, located between the first electrode and the second electrode, wherein the charge trapping layer comprises:
      a first region, having a first dopant and being close to the first electrode; and
      a second region, having a second dopant and being close to the second electrode, wherein the first region and the second region have a same insulating material, and the first dopant and the second dopant are respectively formed in an insulating material of the first region and the second region.

2. The resistive random access memory as claimed in claim 1, wherein the insulating material with an energy gap smaller than 5 eV comprises at least one insulating material selected from a group consisting of $TiO_2$, NiO, HfO, $HfO_2$, ZrO, $ZrO_2$, $Ta_2O_5$, ZnO, $WO_3$, CoO and $Nb_2O_5$.

3. The resistive random access memory as claimed in claim 1, wherein the first dopant comprises at least one element selected from a group consisting of Ti, Zr, Fe, Co, Al, S, N, Ca, Cu, Pb, Sr, Hf, B, C, Mo, Zn, Mg.

4. The resistive random access memory as claimed in claim 1, wherein a concentration of the first dopant in the first region is between 1 at % and 50 at %.

5. The resistive random access memory as claimed in claim 1, wherein the second dopant comprises at least one element selected from a group consisting of Ti, Zr, Fe, Co, Al, S, N, Ca, Cu, Pb, Sr, Hf, B, C, Mo, Zn, Mg.

6. The resistive random access memory as claimed in claim 1, wherein a concentration of the second dopant in the second region is between 10 at % and 90 at %.

7. The resistive random access memory as claimed in claim 1, wherein an energy gap of the second region is greater than an energy gap of the first region by at least 1 eV.

8. The resistive random access memory as claimed in claim 1, wherein the first dopant is different to the second dopant.

9. The resistive random access memory as claimed in claim 1, wherein the first dopant is the same to the second dopant, and a concentration of the first dopant in the first region and a concentration of the second dopant in the second region present a gradient distribution.

10. The resistive random access memory as claimed in claim 1, wherein the first electrode extends along a first direction, the second electrode extends along a second direction, and the first direction is substantially perpendicular to the second direction.

11. The resistive random access memory as claimed in claim 10, wherein the number of the first electrodes is plural, the first electrodes and a plurality of dielectric layers extend along the first direction, and are stacked with each other along a third direction, wherein the charge trapping layer at least covers sidewalls of the first electrodes.

12. The resistive random access memory as claimed in claim 11, wherein the charge trapping layer conformally covers a surface of the first electrodes and the dielectric layers.

13. The resistive random access memory as claimed in claim 11, wherein at least one memory cell is formed at an overlapped portion of each of the first electrodes and the corresponding second electrode.

14. A manufacturing method of a resistive random access memory, comprising:
   providing a first electrode;
   forming a charge trapping layer on the first electrode; and
   forming a second electrode on the charge trapping layer, wherein the charge trapping layer comprises:
      a first region, having a first dopant and being close to the first electrode; and
      a second region, having a second dopant and being close to the second electrode, wherein the first region and the second region have a same insulating material, and the first dopant and the second dopant are respectively formed in an insulating material of the first region and the second region.

15. The manufacturing method of the resistive random access memory as claimed in claim 14, wherein a method for forming the charge trapping layer comprises an atomic layer deposition process, and the atomic layer deposition process comprises:

performing a plurality of first deposition cycles to form a plurality of first material layers having the insulating material;

performing a plurality of second deposition cycles to form a plurality of second material layers having the first dopant, wherein the number of times of the first deposition cycles is greater than the number of times of the second deposition cycles; and     repeating the first deposition cycles and the second deposition cycles until the first region of the charge trapping layer is formed.

16. The manufacturing method of the resistive random access memory as claimed in claim 15, wherein the atomic layer deposition process further comprises:

performing a plurality of third deposition cycles to form a third material layer having the insulating material;

performing a plurality of fourth deposition cycles to form a fourth material layer having the second dopant, wherein the number of times of the fourth deposition cycles is greater than the number of times of the third deposition cycles; and     repeating the third deposition cycles and the fourth deposition cycles until the second region of the charge trapping layer is formed.

17. An operation of a resistive random access memory, comprising:

providing the resistive random access memory as claimed in claim 1;

in a setting operation, applying a positive bias to the second electrode, such that a plurality of electrons is injected to the first region of the charge trapping layer from the first electrode, and is blocked by the second region of the charge trapping layer; and     in a resetting operation, applying a negative bias to the second electrode, such that the electrons are escaped to the first electrode from the first region of the charge trapping layer.

18. The operation of the resistive random access memory as claimed in claim 17, further comprising:

in a read operation, applying a negative bias to the second electrode, such that Fowler-Nordheim (FN) electrons are injected to the first region from the second electrode, and a high resistance state or a low resistance state is determined according to a sum of the electrons in the first region.

19. The operation of the resistive random access memory as claimed in claim 17, wherein before the setting or the resetting operation is performed, a forming operation is not performed.

\* \* \* \* \*